(12) United States Patent
Lee et al.

(10) Patent No.: US 7,662,717 B2
(45) Date of Patent: Feb. 16, 2010

(54) METHOD OF FORMING METAL LAYER USED IN THE FABRICATION OF SEMICONDUCTOR DEVICE

(75) Inventors: Hyun-Suk Lee, Gyeonggi-do (KR); Hyun-Young Kim, Seoul (KR); Kwang-Jin Moon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 115 days.

(21) Appl. No.: 12/100,374

(22) Filed: Apr. 9, 2008

(65) Prior Publication Data

US 2009/0098733 A1    Apr. 16, 2009

Related U.S. Application Data

(62) Division of application No. 11/245,366, filed on Oct. 5, 2005, now Pat. No. 7,416,981.

(30) Foreign Application Priority Data

Oct. 14, 2004    (KR) ............................ 2004-0082027

(51) Int. Cl.
H01L 21/44    (2006.01)
(52) U.S. Cl. ............................... 438/685; 257/E21.168
(58) Field of Classification Search .................. 438/685; 257/E21.168
See application file for complete search history.

(56) References Cited

U.S. PATENT DOCUMENTS

| | | | |
|---|---|---|---|
| 5,155,063 A | 10/1992 | Ito | |
| 5,840,628 A * | 11/1998 | Miyamoto | 438/680 |
| 5,976,976 A | 11/1999 | Doan et al. | |
| 6,214,714 B1 | 4/2001 | Wang et al. | |
| 6,242,804 B1 * | 6/2001 | Inoue | 257/751 |
| 6,399,491 B2 | 6/2002 | Jeon et al. | |
| 6,589,873 B2 | 7/2003 | Taguwa | |
| 6,911,391 B2 | 6/2005 | Yang et al. | |
| 7,022,605 B2 | 4/2006 | Doan et al. | |
| 7,053,009 B2 | 5/2006 | Conley, Jr. et al. | |
| 2002/0164421 A1 | 11/2002 | Chiang et al. | |
| 2004/0018304 A1 | 1/2004 | Chung et al. | |
| 2004/0127027 A1 | 7/2004 | Lee et al. | |
| 2006/0211246 A1 * | 9/2006 | Ishizaka et al. | 438/685 |

* cited by examiner

Primary Examiner—W. David Coleman
Assistant Examiner—Sun M Kim
(74) Attorney, Agent, or Firm—Stanzione & Kim LLP

(57) ABSTRACT

A method of forming a metal layer on the conductive region of a semiconductor device includes concurrently supplying a mixture gas including a hydrogen gas and a metal chloride compound gas, and a purge gas into a chamber having a sealed space for a predetermined time, thereby forming a first metal layer on the semiconductor substrate, using a plasma enhanced chemical vapor deposition (PECVD) method. The hydrogen gas and metal chloride gases are thereafter alternately supplied for a predetermined time while the purge gas is continuously supplied into the chamber, thereby forming a second metal layer on the first metal layer, using a PECVD method. Deterioration of semiconductor devices due to high heat by a conventional CVD method can be prevented using a PECVD method as a low temperature process, thereby improving a production yield.

18 Claims, 10 Drawing Sheets

METHOD OF FORMING METAL LAYER USED IN THE FABRICATION OF SEMICONDUCTOR DEVICE

CROSS-REFERENCE TO RELATED APPLICATION

This application is a Divisional of U.S. patent application Ser. No. 11/245,366, filed Oct. 5, 2005, now pending, which claims the benefit of Korean Patent Application No. 10-2004-0082027, filed Oct. 14, 2004, the disclosures of which are hereby incorporated herein by reference in their entirety.

BACKGROUND OF THE INVENTION

1. Technical Field

The present invention relates to a method of fabricating a semiconductor device, and more particularly, to a method of forming a metal layer in the fabrication of a semiconductor device.

2. Discussion of Related Art

With improvements in semiconductor manufacturing, design rules for such devices are continually being scaled down. Accordingly, the elements forming such devices—including transistor channel length, interconnection width and distance, and contact pad size—are getting smaller and smaller.

But size reduction of these parts brings forth new problems. Contact pads, for instance, need to provide a low resistance contact but resistance increases and the part size is reduced. To address this difficulty, scaled down pads have been formed using a metal silicide layer. Such a metal silicide layer functions as an ohmic layer providing a low resistance interface between a silicon substrate and a metal layer formed thereon. Further, the metal silicide layer functions as a diffusion barrier layer for preventing two discrete materials from being diffused into the other one—that is, between a metal layer and an underneath semiconductor region, or between two metal layers in a multiple metal system.

The metal silicide layer is typically composed of titanium silicide ($TiSi_2$) or a VIII group silicide, for example, $PtSi_2$, $PdSi_2$, $CoSi_2$, $NiSi_2$, and the like, with titanium silicide or cobalt silicide typically being used in a semiconductor device below 0.25 μm.

In a conventional fabrication method, and after a refractory metal layer has been deposited by a sputtering method, an annealing process such as rapid thermal process (RTP) is performed so as to form a metal silicide layer at the interface between the refractory metal layer and an exposed silicon region. Sputtering, however, has a drawback in that it results in poor step coverage by the metal layer within a contact hole having a high depth-to-opening aspect ratio. That is, the deeper the hole and the narrower the opening, the worse the coverage by sputtering up to a predetermined height from the bottom of the contact hole. Furthermore, an insufficient metal silicide layer is formed on the bottom of the contact hole without a subsequent annealing process.

In order to solve the problem of the poor step coverage in the sputtering method, a chemical vapor deposition (CVD) or plasma-enhanced chemical vapor deposition (PECVD) is used to deposit a refractory metal layer and form a metal silicide layer concurrently with the deposition of the refractory metal layer. Formation of the metal silicide layer inside a high and narrow contact hole is improved even without a subsequent annealing process because the refractory metal layer directly reacts with the silicon of an active region. The result of the CVD or PECVD methods are excellent step coverage, which simplifies the fabrication processes. Such a method of forming a metal layer using the CVD or the PECVD method as above is disclosed in U.S. Pat. No. 6,589,873.

FIG. 1 is a sectional view of a semiconductor device illustrating a conventional method of forming a metal layer.

Referring to FIG. 1, the conventional method of forming a metal layer includes supplying a metal chloride compound ($TiCl_4$) into a PECVD chamber concurrently with a hydrogen gas and an argon gas before applying a RF power, thereby forming a metal layer inside a contact hole 311.

Here, the contact hole 311 selectively exposes the surface of polysilicon or silicon substrate doped with conductive impurities used as a conductive layer electrically connected to the metal layer from an interlayer insulating layer 309. For example, a metal oxide semiconductor field effect transistor (MOSFET) is formed below the contact hole 311, and the conductive layer exposed by the contact hole becomes a polysilicon gate electrode or source/drain regions of a silicon substrate.

At this time, if a high RF power is used in forming the metal layer, the gate electrode connected to the metal layer or the interlayer insulating layer is charged by the RF power, so that a gate insulating layer formed below the gate electrode may be damaged. This damage may be prevented by forming the metal layer without applying RF power at the initial time of forming the metal layer.

However, the conventional method of forming a metal layer without RF power has problems as follows.

First, a high temperature (about 1000° C.) is required in a CVD process to promote a chemical reaction between hydrogen and metal chloride compound. Application of high temperature, however, may damage the semiconductor device and reduce the production yield for such devices during mass manufacturing.

Secondly, premature bonding of the hydrogen and silicon to the surface of the polysilicon or silicon substrate may occur in the PECVD process to portions exposed by the contact hole 311. The bonded hydrogen and silicon acts as defects in forming metal silicide which results in an increase in the contact resistances of the conductive layer and the metal layer so that electrical characteristics of a semiconductor device may be deteriorated.

Accordingly, the need exists for a method of forming a contact within a contact hole that overcomes the drawbacks of the prior art.

SUMMARY OF THE INVENTION

Exemplary embodiments of the present invention provide the method of forming a metal layer including concurrently supplying a mixture gas including a hydrogen gas and a metal chloride compound gas, and a purge gas into a chamber having a sealed space for a predetermined time, thereby forming a first metal layer on a semiconductor substrate having a conductive layer exposed, using a PECVD method; and supplying the hydrogen gas and the metal chloride compound gas alternately for a predetermined time while the purge gas is continuously supplied into the chamber, thereby forming a second metal layer on the first metal layer, using a PECVD method.

In another aspect of the present invention, exemplary embodiments of the present invention provide a method of fabricating a semiconductor device including forming a silicon conductive layer selectively exposed by an interlayer insulating layer electrically insulating a semiconductor substrate having plural elements formed thereon; supplying a mixture gas including a hydrogen gas and a metal chloride compound gas, and a purge gas into a chamber having a sealed space concurrently for a predetermined time, thereby forming a first metal layer on the conductive layer, using a PECVD method; and supplying the hydrogen gas and the metal chloride compound gas alternately for a predetermined time while the purge gas is continuously supplied into the chamber, thereby forming a second metal layer on the first metal layer, using a PECVD method.

Exemplary embodiments of the present invention provide a method of forming a metal layer including alternately supplying a metal chloride compound gas and a hydrogen gas into a chamber while a purge gas is supplied at a predetermined flow rate into the chamber, thereby forming a metal layer with a predetermined thickness by a PECVD method, wherein a supplying time of the hydrogen gas is gradually increased.

In another aspect of the present invention, exemplary embodiments of the present invention provide a method of fabricating a semiconductor device including forming a silicon conductive layer selectively exposed by an interlayer insulating layer electrically insulating a semiconductor substrate having plural elements formed thereon; and alternately supplying a metal chloride compound gas and a hydrogen gas into a chamber while a purge gas is supplied at a predetermined flow rate into the chamber, thereby forming a metal layer with a predetermined thickness by a PECVD method, wherein a supplying time of the hydrogen gas is gradually increased.

Exemplary embodiments of the present invention provide a method of forming a metal layer with a predetermined thickness by a PECVD method including alternately supplying a metal chloride compound gas and a hydrogen gas into a chamber into which a purge gas is continuously supplied at a predetermined flow rate, wherein a plasma reaction energy is gradually increased every time the hydrogen gas is supplied.

In another aspect of the present invention, exemplary embodiments of the present invention provide a method of fabricating a semiconductor device including forming a silicon conductive layer selectively exposed by an interlayer insulating layer electrically insulating a semiconductor substrate having plural elements formed thereon; and alternately supplying a metal chloride compound gas and a hydrogen gas into a chamber while a purge gas is supplied at a predetermined flow rate into the chamber, thereby forming a metal layer with a predetermined thickness by a PECVD method, wherein a plasma reaction energy is gradually increased every time the hydrogen gas is supplied.

Exemplary embodiments of the present invention provide a method of forming a metal layer with a predetermined thickness by a PECVD method including alternately supplying a metal chloride compound gas and a hydrogen gas into a chamber into which a purge gas is continuously supplied at a predetermined flow rate, wherein a supplying time of the hydrogen gas is gradually increased and a plasma reaction energy is gradually increased every time the hydrogen gas is supplied.

In another aspect of the present invention, exemplary embodiments of the present invention provide a method of fabricating a semiconductor device including forming a silicon conductive layer selectively exposed by an interlayer insulating layer electrically insulating a semiconductor substrate having plural elements formed thereon; and alternately supplying a metal chloride compound gas and a hydrogen gas into a chamber while a purge gas is supplied at a predetermined flow rate into the chamber, thereby forming a metal layer with a predetermined thickness by a PECVD method, wherein a plasma reaction energy is gradually increased every time the hydrogen gas is supplied.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided as teaching examples of the invention. Like numbers refer to like elements.

Figure 1:
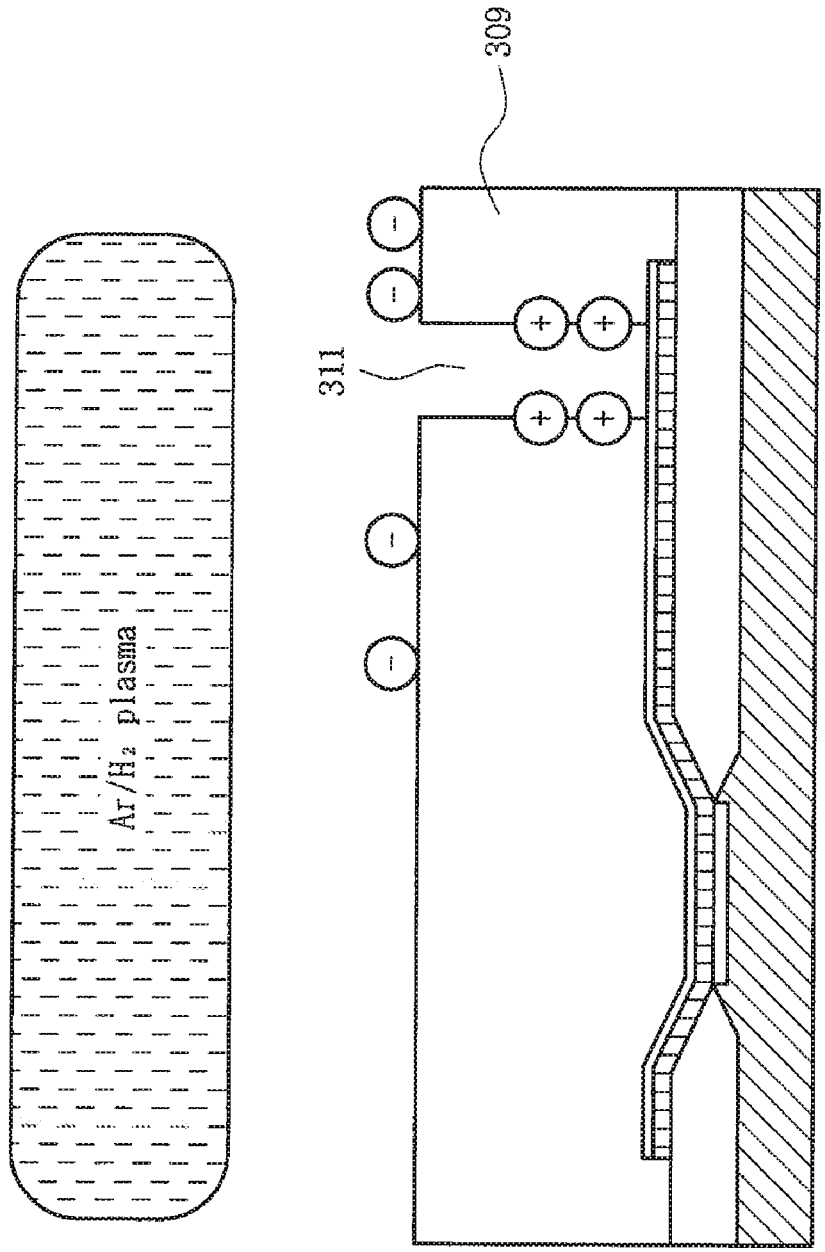
FIG. 1 is a sectional view of a semiconductor device illustrating a conventional method of forming a metal layer.
Figure 2:
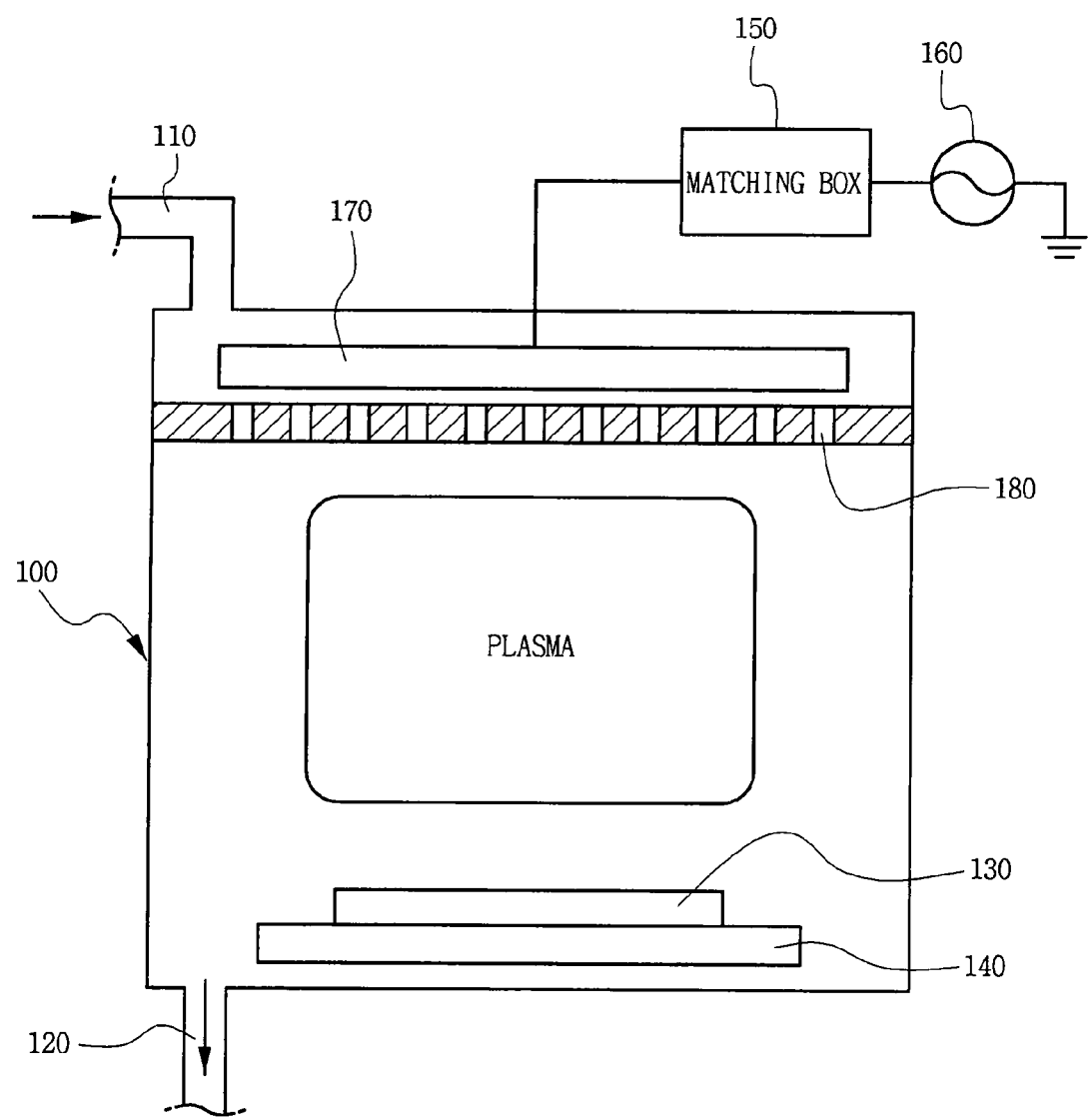
FIG. 2 is a sectional view schematically illustrating a plasma-enhanced chemical vapor deposition apparatus used in the method of forming a metal layer according to the present invention.

FIG. 2 is a sectional view schematically illustrating a plasma-enhanced chemical vapor deposition (PECVD) apparatus used in the method of forming a metal layer according to the present invention.

Referring to FIG. 2, the PECVD apparatus includes a chamber 100 in which a deposition process is performed. Reaction gases and purge gases are supplied into the chamber 100 through a gas supply line 110. The gas supply line 110 supplies a purge gas such as argon (Ar), and a reaction gas such as a hydrogen ($H_2$) gas or a metal chloride gas. A shower head 180 uniformly sprays the reaction gas or the purge gas, which is introduced into the chamber 100 through the gas supply line 110, toward a semiconductor substrate 130 at a predetermined flow rate. The gases supplied to the chamber 100 through the gas supply line 110 are measured by a mass-flow controller when supplied. Further, a vacuum pump (not shown) is connected to the chamber 100 via an exhaust line 120 to decrease a pressure inside the chamber 100 and exhaust the gases there inside out of the chamber 100.

A supporting table 140 for supporting the semiconductor substrate 130 is located inside the chamber 100. Even though not shown in the drawing, the supporting table 140 may have a heater for controlling a temperature of the semiconductor substrate. An upper electrode 170, which is connected to a matching box 150 and a power source 160, is located inside the chamber 100 to induce a plasma reaction. The power source 160 supplies about 50 to 900 W of power, for example, about 200 W at a low frequency of about 400 to 500 kHz, for example, about 460 kHz to the upper electrode 170. The power generated from the power source 160 activates plasma reaction of reaction gases. By the plasma reaction, a metal layer such as a titanium layer is formed on the substrate, and the reaction by-products generated by the plasma reaction are removed out of the chamber 100 through a vent line 120 by pumping of a vacuum pump (not shown).

A method of fabricating a semiconductor device using the PECVD apparatus structured as above will be explained as follows.

Figure 3:
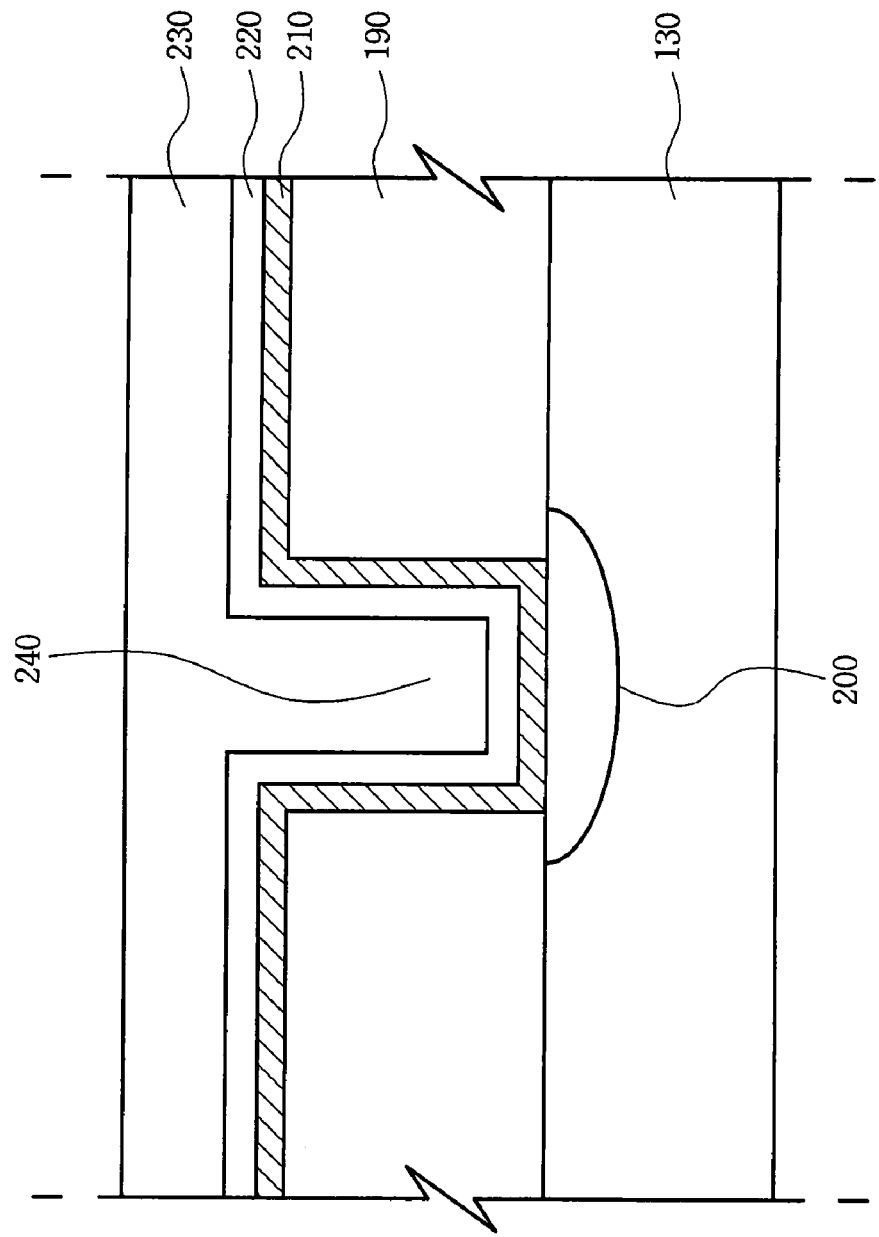
FIG. 3 is a sectional view illustrating a contact pad structure resulting from a method for fabricating such a semiconductor device according to the present invention.

FIG. 3 is a sectional view illustrating a semiconductor device formed according to a method of the present invention.

As shown in FIG. 3, in the method of fabricating a semiconductor device according to the present invention, a conductive region 200 is formed by implanting conductive impurity ions into the single crystal silicon semiconductor substrate 130, or a contact pad (not shown) is formed to be electrically connected to the semiconductor substrate 130, using polycrystal silicon formed by implanting the conductive impurity ions. An interlayer insulating layer 190 is formed on the overall surface of the semiconductor substrate 130 with a predetermined thickness, and a photoresist pattern (not shown) is formed on the interlayer insulating layer 190 to selectively expose the interlayer insulating layer 190 formed on the conductive region 200 or the contact pad. Using the photoresist pattern as an etch mask, the interlayer insulating layer 190 is removed, and the photoresist pattern is removed, thereby forming a contact hole 240 selectively exposing the conductive region 200 or the contact pad by the interlayer insulating layer 190.

Then, a titanium layer 210 (referred to as a metal layer) with a predetermined thickness is formed on the semiconductor substrate 130 having the contact hole 240 formed thereon, using a PECVD method. A titanium nitride layer 220 is formed on the titanium layer 210, and a tungsten layer 230 is formed on the titanium nitride layer 220, using a PECVD method or sputtering method.

Here, the titanium layer 210 forms a titanium silicide at the interface with the silicon conductive region 200 or the contact pad through the contact hole 240, and reduces a contact resistance. For example, the titanium layer 210 may be formed by supplying an argon gas as an inert gas, a titanium chloride ($TiCl_4$) gas as a reaction gas, and a hydrogen gas to decompose titanium element from the titanium chloride gas (hereinafter, referred to as metal chloride compound) into the chamber 100, with a thickness of about 100 Å.

The PECVD method is used to prevent diffusion of conductive impurities in the conductive region 200 and the channel region, and to prevent deterioration of semiconductor devices as would occur using a chemical vapor deposition method as a high temperature process.

In order to form the titanium silicide to reduce a contact resistance at the surface of the silicon conductive region 200 exposed by the contact hole 240 or the contact pad, heat is necessary to volatilize chlorine element from the metal chloride compound as well as to expose the metal chloride compound to the hydrogen gas. In the meantime, in order to prevent bonding of silicon and hydrogen at the surface of the conductive region 200 or the contact pad, the hydrogen gas may not be used during the initial time of forming the titanium layer 210.

Accordingly, a method of forming the titanium layer 210 in use for the fabrication of semiconductor devices will now be explained with exemplary embodiments using a PECVD method employing a lower temperature process than a CVD method.

Figure 4:
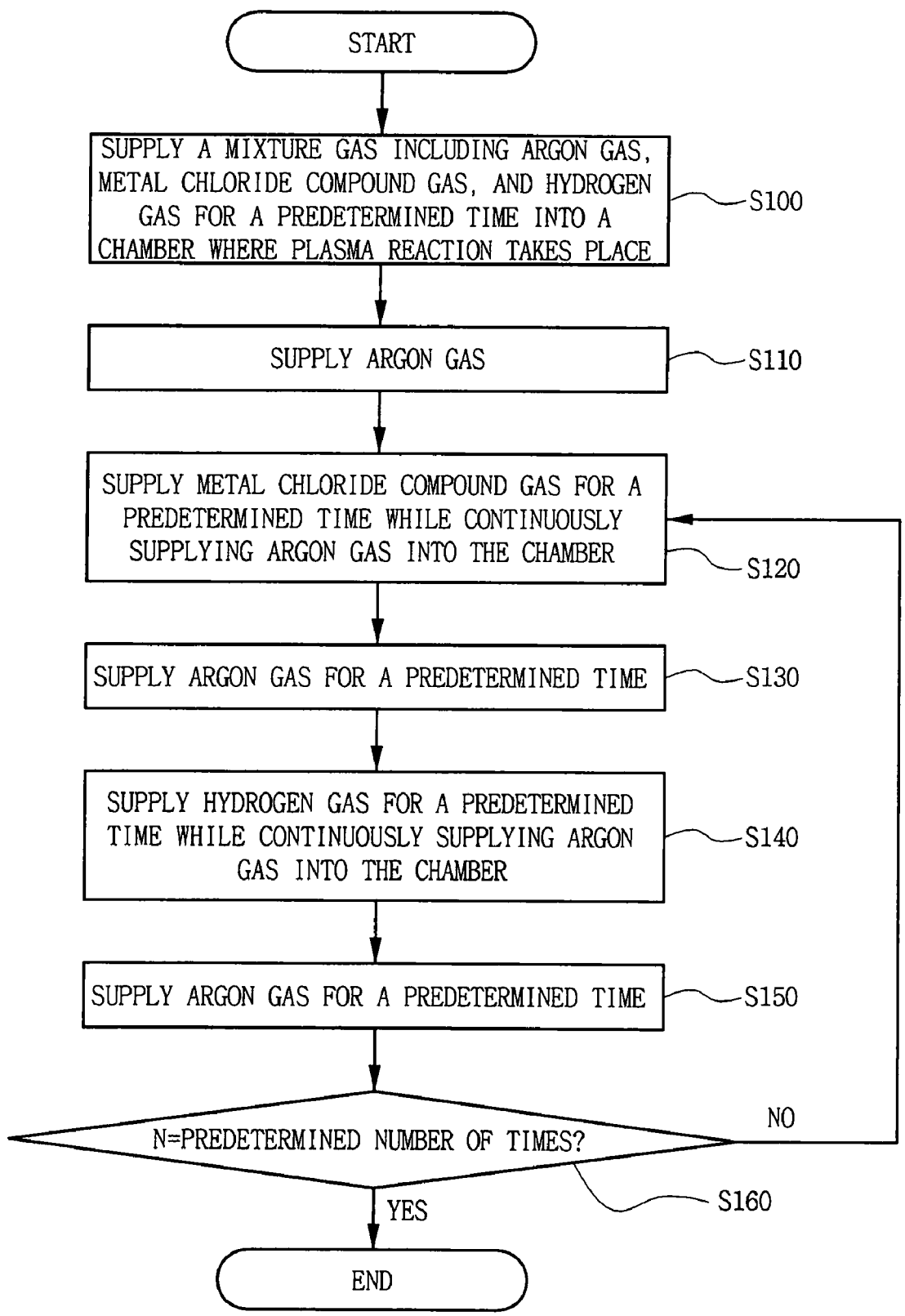
FIG. 4 is a flow chart schematically illustrating a method of forming a titanium layer according to a first embodiment of the present invention.

FIG. 4 is a flow chart schematically illustrating a method of forming the titanium layer 210 according to a first embodiment of the present invention.

As shown in FIG. 4, a mixture gas including hydrogen and metal chloride compound ($TiCl_4$) and a purge gas are supplied concurrently for a predetermined time into the sealed chamber 100 (FIG. 2), thereby forming a first titanium layer on the exposed conductive layer of a semiconductor substrate 130 using a PECVD method (S100).

Here, the first titanium layer is composed of titanium silicide at the interface of the conductive region 200 or the contact pad, and is formed with a predetermined thickness at a temperature necessary to form metal silicide.

For example, the first titanium layer may be formed with a thickness of about 30 Å by flowing an argon gas at about 300 sccm, a hydrogen gas at about 2000 sccm, and a metal chloride compound gas at about 3 to 5 sccm inside the chamber 100 for about 5 to 6 seconds. At this time, a pressure of the chamber 100 is about 0.1 to 10 Torr, and a temperature thereof is about 400 to 600° C., preferably about 450° C. Further, about 200 W of RF power is applied through the upper electrode 170 during the process of forming the first titanium layer.

Then, supplying of the mixture gas into the chamber 100 is stopped for a predetermined time, and only argon gas is supplied into the chamber 100 (S110).

Then, while the argon gas is continuously flowed into the chamber 100, the metal chloride compound gas is supplied for a predetermined time (S120). Then, supplying of the metal chloride compound gas is stopped, and only the argon gas is flowed into the chamber 100 for a predetermined time (S130). Then, while the argon gas is continuously flowed, the hydrogen gas is supplied for a predetermined time (S140) and then stopped. Then, only the argon gas is flowed into the chamber 100 for a predetermined time (S150), thereby forming a second titanium layer on the first titanium layer.

Finally, the hydrogen gas and the metal chloride compound gas are alternately supplied into the chamber 100 by a predetermined number of times until a thickness of the second titanium layer reaches a predetermined value (S160).

That is, the first titanium layer is formed using the mixture gas including the hydrogen gas and the metal chloride compound gas, and the second titanium layer is formed on the first titanium layer by supplying the hydrogen gas and the metal chloride compound gas alternately as a single gas for a predetermined time while the purge gas is continuously supplied into the chamber 100, and during the operation, by allowing a purging time to flow only the argon gas inside the chamber 100 for a predetermined time for purging.

For example, the second titanium layer may be formed by repeatedly performing a following cycle by about 7 to 15 times, with a thickness of about 70 Å, and one cycle includes supplying the metal chloride compound gas and the argon gas into the chamber 100 for about 10 to 20 seconds, supplying only the argon gas for about 10 to 20 seconds, supplying the hydrogen gas and the argon gas for about 10 to 20 seconds, and supplying only the argon gas for about 10 to 20 seconds. At this time, the second titanium layer may be formed with a temperature inside the chamber 100 about 400 to 600° C., preferably about 450° C. Further, a pressure of the chamber 100 is about 0.1 to 10 Torr. The second titanium layer may be formed with about 200 W of RF power like the first titanium layer.

Figure 5:
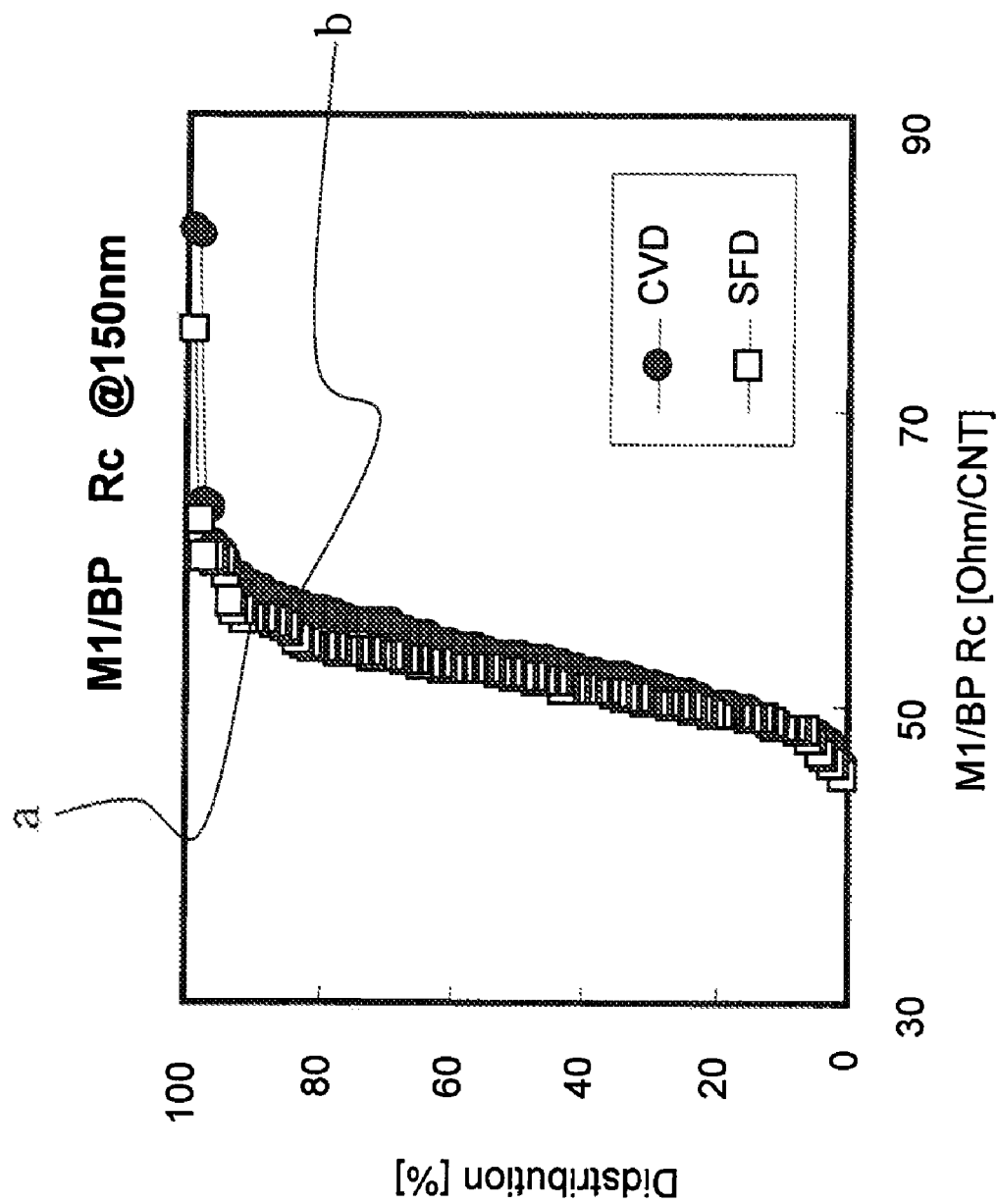
FIGS. 5 and 6 are graphs illustrating comparison of a distribution of contact resistances of a semiconductor device fabricated using the method of forming the titanium layer according to a first embodiment of the present invention, and a distribution of contact resistances of the semiconductor device fabricated by the conventional method of forming the titanium layer using a mixture gas or a single gas only.
Figure 6:
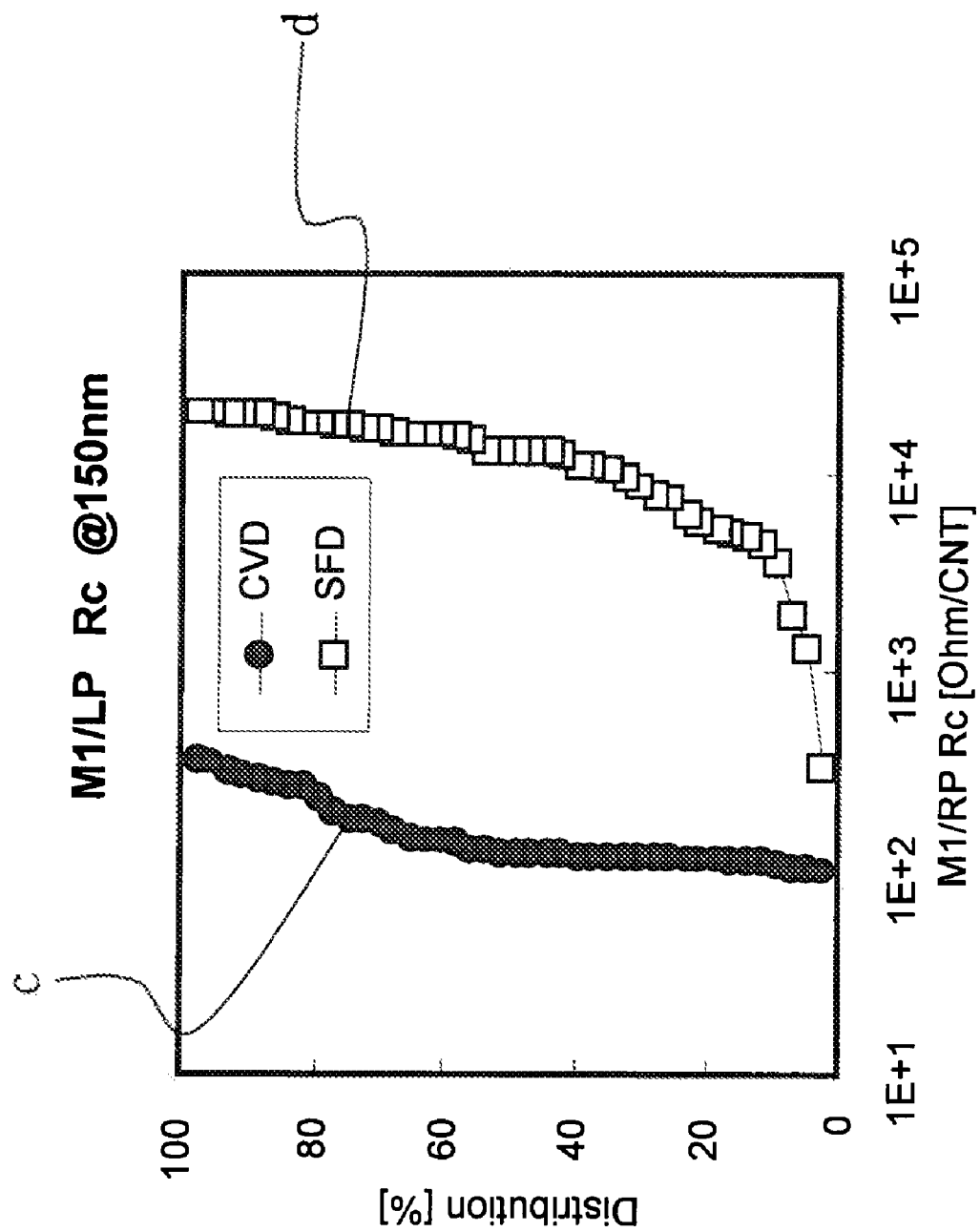

FIGS. 5 and 6 are graphs illustrating comparison of a distribution of contact resistances of the semiconductor device fabricated using the method of forming the titanium layer according to a first embodiment of the present invention, and a distribution of contact resistances of the semiconductor device fabricated by the method of forming the titanium layer using a conventional mixture gas or a single gas only. As shown in the drawings, the distribution (a) of contact resistances of the semiconductor device fabricated using the method of forming the titanium layer according to a first embodiment of the present invention is superior to the distributions (b, c, d) of contact resistances of the semiconductor device fabricated by the method of forming the titanium layer using a conventional mixture gas or a single gas only.

In this graph, a transverse axis of the graph represents a dimension of a contact resistance, and a vertical axis of the graph represents a distribution of a contact resistance, and superiority of a semiconductor device is normally determined around about 50% of the distribution.

In the method of forming the titanium layer 210 according to a first embodiment of the present invention, after the first titanium layer with a predetermined thickness is formed using a mixture gas including a hydrogen gas and a metal chloride compound gas, the second titanium layer is formed on the first titanium layer, by flowing the hydrogen gas and the metal chloride compound gas individually as a single gas with a predetermined time for purging. In the method of forming the titanium layer using a conventional mixture gas, a single titanium layer (b, c) is formed by selectively flowing a metal chloride compound gas during the flowing of a purge gas and a hydrogen gas, or a single titanium layer (d) is formed by flowing a hydrogen gas and a metal chloride compound gas individually as a single gas for a predetermined time.

Therefore, the method of forming the titanium layer 210 according to a first embodiment of the present invention further increases or optimizes a production yield than the conventional method using a CVD method, because the titanium layer 210 is formed using a low temperature PECVD method according to the present invention so as to prevent deterioration of semiconductor devices due to a high temperature.

Figure 7:
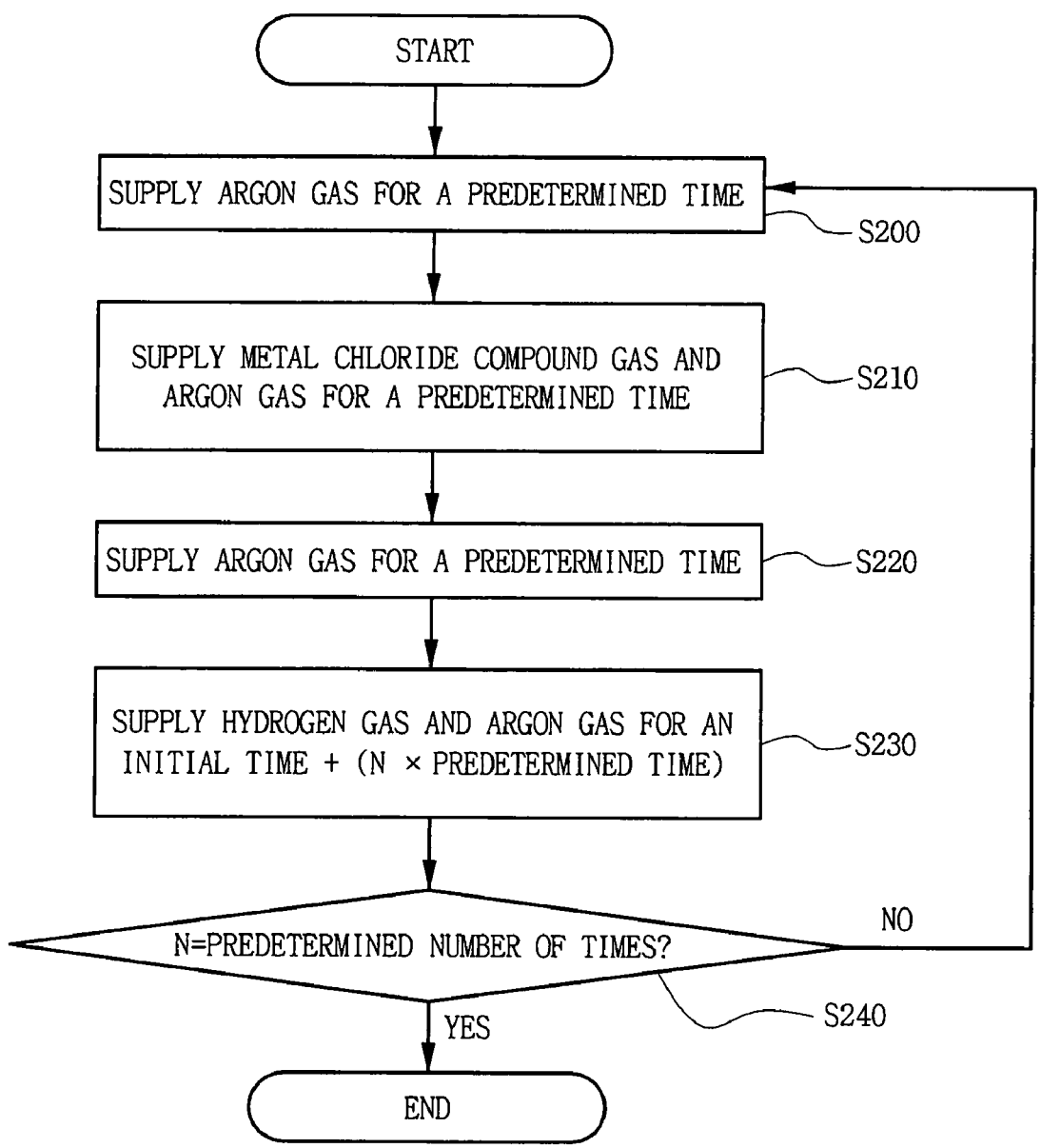
FIG. 7 is a flow chart schematically illustrating a method of forming a titanium layer according to a second embodiment of the present invention.

FIG. 7 is a flow chart schematically illustrating a method of forming a titanium layer according to a second embodiment of the present invention.

Referring to FIG. 7, the method of forming a titanium layer 210 according to a second embodiment of the present invention includes flowing only an argon gas at a predetermined flow rate for a predetermined time (S200).

Then, while the argon gas is continuously flowed into the chamber 100, a metal chloride compound gas is supplied for a predetermined time (S210). Then, the supplying of the metal chloride compound gas is stopped, and only the argon gas is flowed into the chamber 100 for a predetermined time (S220). Then, while the argon gas is continuously flowed, the hydrogen gas is supplied for a predetermined time (S230), thereby forming the titanium layer 210.

Then, the supplying of the hydrogen gas is stopped, and only the argon gas is flowed into the chamber 100 for a predetermined time. The metal chloride compound gas and the hydrogen gas are alternately supplied into the chamber 100 (S240) until the titanium layer 210 is formed with a predetermined thickness. At this time, the supplying time of the hydrogen gas is gradually increased as compared to the initial supplying time, so that the hydrogen gas is supplied into the chamber 100 (S230).

That is, while the argon gas is supplied into the chamber 100 at a predetermined flow rate by a CVD method, the metal chloride compound gas and the hydrogen gas are alternately supplied, in which the supplying time of the hydrogen gas is gradually increased to form the titanium layer 210 with a predetermined thickness.

For example, in order to form the titanium layer 210 with a thickness of about 100 Å, the metal chloride compound gas and the argon gas are supplied into the chamber 100 for about 10 to 20 seconds, and then, only the argon gas is supplied for about 10 to 20 seconds. The hydrogen gas and the argon gas are supplied for about 5 seconds, and then, only the argon gas is supplied for about 10 to 20 seconds. The metal chloride compound gas and the argon gas are supplied into the chamber 100 for about 10 to 20 seconds, and then, only the argon gas is supplied for about 10 to 20 seconds. Then, the hydrogen gas and the argon gas are supplied for about 10 seconds, which is 5 seconds more than the initial time, about 5 seconds, of supplying the hydrogen, and then, only the argon gas is supplied for about 10 to 20 seconds. The cycle is repeated by about 7 to 15 times. At this time, the supplying time of the hydrogen gas is gradually increased with every repetition. This process regulates the decomposition of the metal chloride compound formed on the conductive region 200 or the contact pad exposed through the contact hole 240 and formation of the titanium layer 210. Further, the titanium layer 210 may be formed with a temperature inside the chamber 100 at about 400 to 600° C., preferably at about 450° C. Further, a pressure of the chamber 100 is about 0.1 to 10 Torr. The titanium layer 210 is formed with about 200 W of RF power applied.

Figure 8:
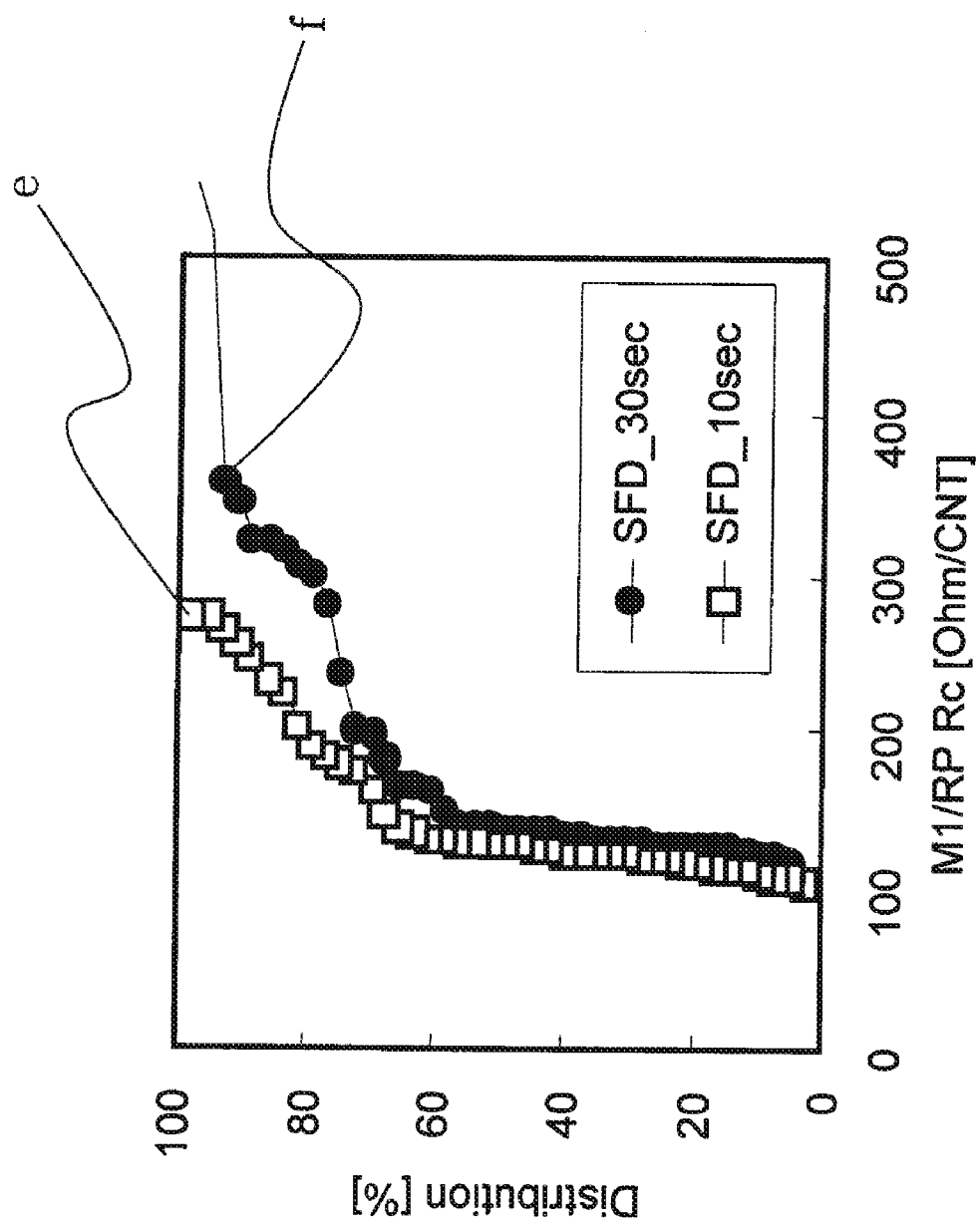
FIG. 8 is a graph illustrating a distribution of contact resistances of a semiconductor device fabricated by a method of forming a titanium layer according to a second embodiment of the present invention.

FIG. 8 is a graph illustrating a distribution of contact resistances of a semiconductor device fabricated by a method of forming a titanium layer according to a second embodiment of the present invention. A distribution (e) of contact resistances of the semiconductor device fabricated by a method of forming a titanium layer according to a second embodiment of the present invention, in which the titanium layer 210 is formed while gradually increasing the supplying time of the hydrogen gas from the initial time, is superior to a distribution (f) of contact resistances of the semiconductor device fabricated by a method of forming the titanium layer 210 with the supplying time of the hydrogen gas remaining constant.

In this graph, a transverse axis of the graph represents a dimension of a contact resistance, and a vertical axis of the graph represents a distribution of a contact resistance, and superiority of a semiconductor device is normally determined around about 50% of the distribution. At this time, when an initial titanium layer 210 is formed on the conductive region 200 or the surface of the contact pad, if a small amount of hydrogen gas is flowed, the contact resistance is decreased. By exposing the conductive region 200 or the silicon of the contact pad to the metal chloride compound gas first, a metal chloride compound is formed on the surface of the conductive region or the contact pad. Then, by exposing the metal chloride compound to the hydrogen gas, defects due to hydrogen bonding on the surface of the conductive region 200 or the contact pad can be prevented.

Therefore, the method of forming the titanium layer 210 according to a second embodiment of the present invention can reduce a contact resistance of silicon and the titanium layer 210 by flowing a smaller amount of the hydrogen gas than the metal chloride compound gas during the formation of the initial titanium layer 210 so as to reduce the hydrogen bonding on the conductive region 200 or the silicon surface of the contact pad exposed by the contact hole 240, thereby to reduce generation of defects. That is, the hydrogen gas can be flowed at 2000 sccm for a much shorter time than the 3-5 sccm flow rate of the metal chloride so that the total amount of the hydrogen gas flowed during the formation of the initial titanium layer is smaller than the total amount of the metal chloride compound gas flowed during the formation of the same layer.

Figure 9:
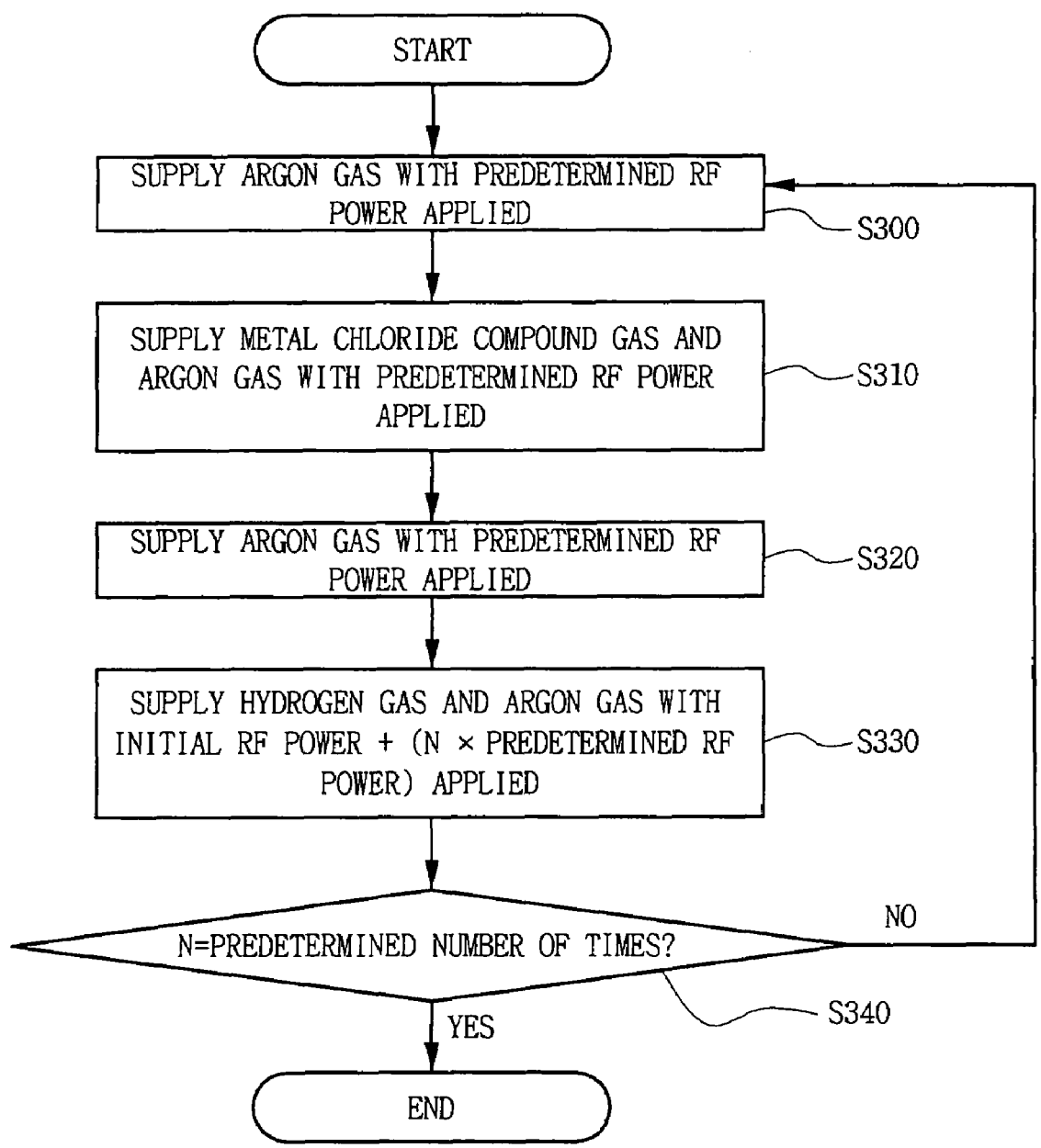
FIG. 9 is a flow chart schematically illustrating a method of forming a titanium layer according to a third embodiment of the present invention.

FIG. 9 is a flow chart schematically illustrating a method of forming a titanium layer according to a third embodiment of the present invention.

Referring to FIG. 9, in the method of forming the titanium layer 210 according to a third embodiment of the present invention, only the argon gas is flowed at a predetermined flow rate inside the chamber 100 for a predetermined time with a predetermined RF power (S300). For example, about 200 W of RF power is applied to the upper electrode 170 to induce plasma reaction inside the chamber 100.

Then, while the argon gas is continuously flowed into the chamber 100, the metal chloride compound gas is supplied for a predetermined time (S310). Then, the supplying of the metal chloride compound gas is stopped, and only the argon gas is flowed into the chamber 100 for a predetermined time (S320). In the same way, about 200 W of RF power is applied to the upper electrode 170 to induce plasma reaction inside the chamber 100. Then, the argon gas is continuously flowed, and the hydrogen gas is supplied for a predetermined time (S330) to form the titanium layer 210. At this time, about 50 W of RF power is applied to the upper electrode 170, so as to induce plasma reaction inside the chamber 100. Therefore, the plasma reaction at a low energy during the supplying of the hydrogen gas reduces the reaction by the hydrogen gas on the conductive region 200 or the silicon surface of the contact pad, thereby to reduce defects due to the hydrogen bonding on the silicon surface.

Then, the supplying of the hydrogen gas is stopped, and only the argon gas is flowed into the chamber 100 for a predetermined time. The metal chloride compound gas and the hydrogen gas are alternately supplied into the chamber 100 until the titanium layer 210 is formed with a predetermined thickness (S340). At this time, the RF power during the supplying of the hydrogen gas is gradually increased more than at the initial supplying.

That is, while alternately supplying the metal chloride compound gas and the hydrogen gas into the chamber 100, in which a purge gas at a predetermined flow rate is supplied, using a PECVD method with a predetermined RF power, the RF power is lower during the initial supplying of the hydrogen gas than during the supplying of other gases, but the RF power is gradually increased every time of supplying the hydrogen gas after the initial supplying, thereby to form the titanium layer 210 with a predetermined thickness.

For example, in order to form the titanium layer 210 with a thickness of about 100 Å, the metal chloride compound gas and the argon gas are supplied into the chamber 100 for about 10 to 20 seconds with about 200 W of RF power, and then, only the argon gas is supplied for about 10 to 20 seconds. The hydrogen gas and the argon gas are supplied for about 10 to 20 seconds of an initial supplying time with about 50 W of RF power, and then, only the argon gas is supplied for about 10 to 20 seconds with about 200 W of RF power. The metal chloride compound gas and the argon gas are supplied into the chamber 100 for about 10 to 20 seconds, and then, only the argon gas is supplied for about 10 to 20 seconds. Then, the hydrogen gas and the argon gas are supplied for about 10 to 20 seconds with about 100 W of RF power, which is 50 W higher than the about 50 W of initial RF power, and then, only the argon gas is supplied for about 10 to 20 seconds with about 200 W of RF power. The cycle is repeated by about 7 to 15 times. At this time, the supplying time of the hydrogen gas is maintained same as the initial supplying time, but the RF power is gradually increased in subsequent steps. This process regulates the decomposition of the metal chloride compound formed on the conductive region 200 or the contact pad exposed through the contact hole 240, and formation of the titanium layer 210. Further, the titanium layer 210 may be formed inside the chamber 100, inner temperature of which is about 400 to 600° C., preferably about 450° C. Further, a pressure of the chamber 100 is about 0.1 to 10 Torr. The titanium layer 210 formed on the conductive region 200 or the contact pad may be converted to titanium silicide by chemical bonding of silicon and titanium.

Therefore, the method of forming the titanium layer 210 according to a third embodiment of the present invention can reduce a contact resistance of silicon and the titanium layer 210 by applying a lower RF power while supplying of the hydrogen gas into the chamber 100 during initial formation of the titanium layer 210 than during supplying of the metal chloride compound gas, so as to reduce the hydrogen bonding at the silicon interface of the conductive region 200 or the contact pad exposed by the contact hole 240, thereby to reduce generation of defects.

Figure 10:
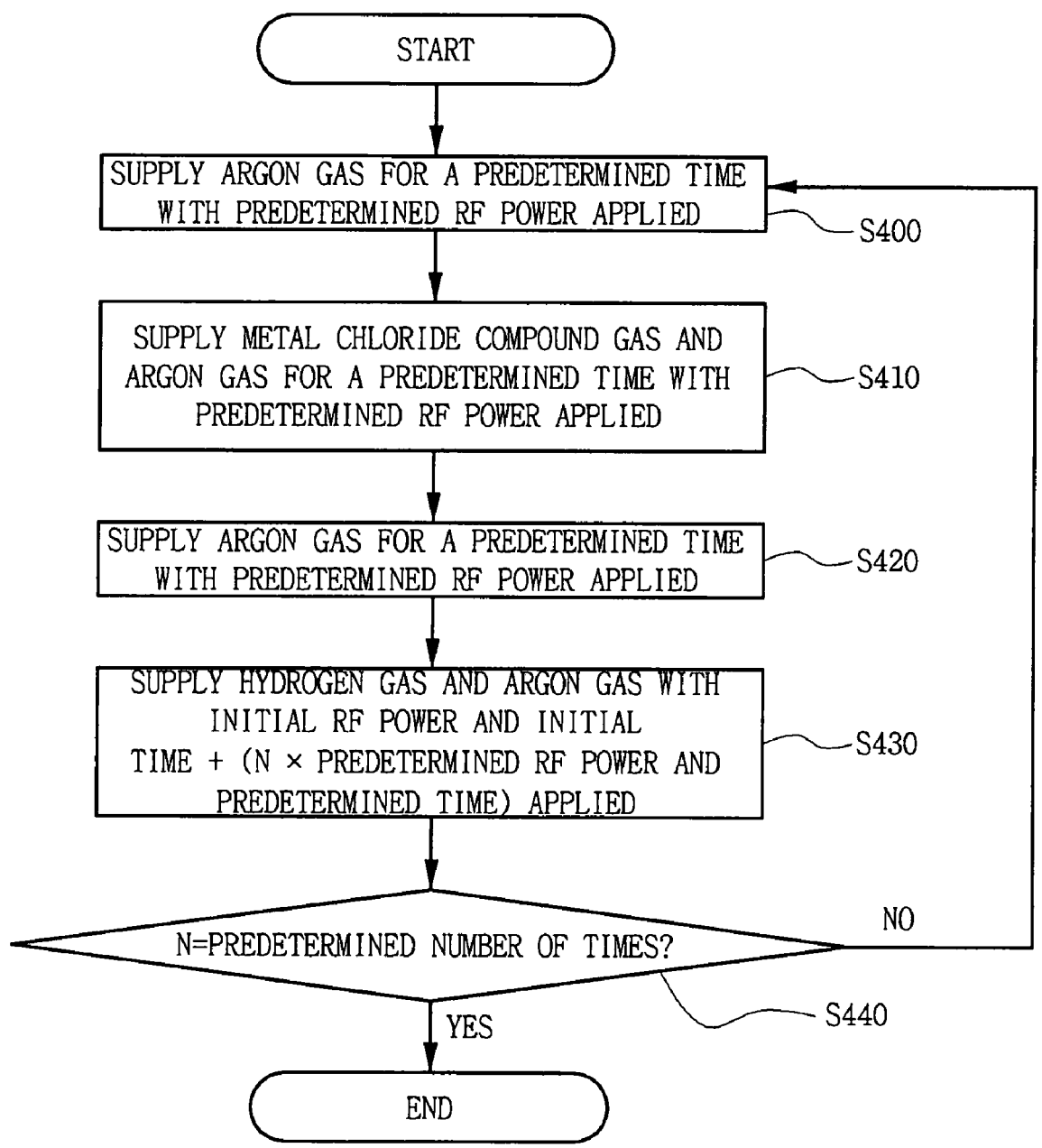
FIG. 10 is a flow chart schematically illustrating a method of forming a titanium layer according to a fourth embodiment of the present invention.

FIG. 10 is a flow chart schematically illustrating a method of forming a titanium layer according to a fourth embodiment of the present invention.

Referring to FIG. 10, in the method of forming the titanium layer 210 according to a fourth embodiment of the present invention, only the argon gas at a predetermined flow rate is flowed into the chamber 100 for a predetermined time (S400). About 200 W of RF power is applied to the upper electrode 170 to induce plasma reaction inside the chamber 100.

Then, while the argon gas is continuously flowed into the chamber 100, the metal chloride compound gas is supplied for a predetermined time (S410). Then, the supplying of the metal chloride compound gas is stopped, and only the argon gas is flowed into the chamber 100 for a predetermined time (S420). In the same way, about 200 W of RF power is applied to the upper electrode 170 to induce plasma reaction inside the chamber 100. Then, while the argon gas is continuously flowed, the hydrogen gas is supplied for a predetermined time with a predetermined RF power applied (S430), thereby to form the titanium layer 210. For example, about 50 W of RF power is applied to the upper electrode 170, and the hydrogen gas is flowed for about 5 seconds. Thus, the plasma reaction at a low energy during the supplying of the hydrogen gas reduces reaction by the hydrogen gas on the conductive region 200 or on the silicon surface of the contact pad, and by flowing the hydrogen gas for a shorter time than during the flowing time of the metal chloride compound gas, defects due to hydrogen bonding at the silicon interface can be reduced.

Then, the supplying of the hydrogen gas is stopped, and only the argon gas is flowed into the chamber 100 for a predetermined time. The cycle is repeated by a predetermined number of times until a thickness of the titanium layer 210 reaches a predetermined value, and thus, the metal chloride compound gas and the hydrogen gas are alternately supplied into the chamber 100 (S440). At this time, the hydrogen gas is supplied into the chamber 100 while the RF power is gradually increased during the supplying of the hydrogen gas as compared to the initial supplying step.

That is, while the argon gas at a predetermined flow rate is supplied into the chamber 100, the metal chloride compound gas and the hydrogen gas are alternately supplied into the chamber 100 by a PECVD method to form the titanium layer 210 with a predetermined thickness. Here, the hydrogen gas is supplied at the initial supplying step with a low RF power and a short supplying time, and then, the RF power and the supplying time are increased every supplying step of the hydrogen gas after the initial supplying step.

For example, the metal chloride compound gas and the argon gas are supplied into the chamber 100 for about 10 to 20 seconds with about 200 W of RF power, and then, only the argon gas is supplied for about 10 to 20 seconds. The hydrogen gas and the argon gas are supplied for about 5 seconds with about 50 W of RF power, and then, only the argon gas is supplied for about 10 to 20 seconds with about 200 W of RF power. The metal chloride compound gas and the argon gas are supplied into the chamber 100 for about 10 to 20 seconds, and then, only the argon gas is supplied for about 10 to 20 seconds. The hydrogen gas and the argon gas are supplied for about 10 seconds, about 5 seconds more than the initial supplying time, with about 100 W of RF power, about 50 W more than the initial RF power, and then, only the argon gas is supplied for about 10 to 20 seconds with about 200 W of RF power. The above cycle is repeated by about 7 to 15 times to form the titanium layer 210 with a thickness of about 100 Å. At this time, the supplying time of the hydrogen gas and the RF power applied during the supplying of the hydrogen gas are gradually increased in subsequent steps. This process regulates the decomposition of the metal chloride compound formed on the conductive region 200 or the contact pad exposed through the contact hole 240, and formation of the titanium layer 210. Further, the titanium layer 210 may be formed inside the chamber 100, inner temperature of which is about 400 to 600° C., preferably about 450° C. Further, a pressure of the chamber 100 is about 0.1 to 10 Torr. The titanium layer 210 formed on the conductive region 200 or the contact pad may be converted to titanium silicide by chemical bonding of silicon and titanium.

Therefore, the method of forming the titanium layer 210 according to a fourth embodiment of the present invention can reduce a contact resistance of silicon and the titanium layer 210 by applying a lower RF power and a shorter supplying time during supplying of the hydrogen gas into the chamber 100 during initial formation of the titanium layer 210 than during supplying of the metal chloride compound gas, so as to reduce the hydrogen bonding at the silicon surface of the conductive region 200 or the contact pad exposed by the contact hole 240, thereby to reduce generation of defects.

Further, the description of the exemplary embodiments as above has been made to provide better and more complete understanding of the present invention with reference to the attached drawings, but it must not be understood to limit the present invention. For example, the present invention also includes reducing the supplying amount of the hydrogen gas as a decomposition gas of a metal compound during formation of a metal layer formed on the silicon of the conductive region 200 or the contact pad, or reducing a RF power required for plasma reaction, thereby to prevent the hydrogen bonding on the silicon surface.

As described above, according to the present invention, a titanium layer is formed using a low temperature process of a PECVD method rather than the conventional CVD method, thereby to prevent deterioration of semiconductor devices due to a high temperature, and increase or optimize a production yield.

Further, the hydrogen gas is supplied during formation of the initial titanium layer at a lower float rate than the flow rate of the metal chloride compound gas, and plasma reaction energy every time of supplying the hydrogen gas is reduced to reduce the hydrogen bonding on the silicon surface of the conductive region or the contact pad exposed by the contact hole, and to reduce defects, thereby reduce the contact resistance of the silicon and the titanium layer.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A method of forming a metal layer with a predetermined thickness by a PECVD method comprising:
    alternately supplying a plurality of times a metal chloride compound gas and a hydrogen gas into a chamber;
    continuously supplying a purge gas into the chamber at a predetermined flow rate;
    applying a plasma reaction energy during the hydrogen gas supply steps; and
    gradually increasing the plasma reaction energy applied in each subsequent hydrogen supply step.

2. The method according to claim 1, when the hydrogen gas and the metal chloride compound gas are alternately supplied into the chamber, the method further comprising supplying only the purge gas for a predetermined purge time between the supplying of the hydrogen gas and the supplying of the metal chloride compound gas.

3. The method according to claim 2, wherein the purge time is about 10 to 20 seconds.

4. The method according to claim 1, wherein the purge gas is supplied into the chamber at a flow rate of about 300 sccm.

5. The method according to claim 1, wherein the metal chloride compound gas, which is supplied into the chamber alternately with the hydrogen gas, is supplied at a flow rate of about 3 to 5 sccm for about 10 to 20 seconds.

6. The method according to claim 1, wherein the hydrogen gas, which is supplied into the chamber alternately with the metal chloride compound gas, is supplied at a flow rate of about 2000 sccm for about 10 to 20 seconds at an initial time.

7. The method according to claim 1, wherein 50 W of plasma reaction energy is applied when the hydrogen gas is supplied into the chamber at an initial time.

8. The method according to claim 7, wherein, when the hydrogen gas is supplied into the chamber, the plasma reaction energy is increased in each subsequent hydrogen supply step by about 50 to 100 W from the plasma reaction energy applied when the hydrogen gas is supplied at an initial time.

9. The method according to claim 1, wherein the metal layer is formed by applying 200 W of plasma reaction energy when the metal chloride compound gas or the purge gas only is supplied into the chamber.

10. A method of fabricating a semiconductor device comprising:
    forming a silicon conductive layer selectively exposed by an interlayer insulating layer electrically insulating a semiconductor substrate having plural elements formed thereon; and
    alternately supplying a metal chloride compound gas and a hydrogen gas into a chamber while a purge gas is supplied at a predetermined flow rate into the chamber, thereby forming a metal layer with a predetermined thickness by a PECVD method, wherein a plasma reaction energy is gradually increased every time the hydrogen gas is supplied.

11. The method according to claim 10, when the hydrogen gas and the metal chloride compound gas are alternately supplied into the chamber, the method further comprising supplying only the purge gas for a predetermined purge time between the supplying of the hydrogen gas and the supplying of the metal chloride compound gas.

12. The method according to claim 11, wherein the purge time is about 10 to 20 seconds.

13. The method according to claim 10, wherein the purge gas is supplied into the chamber at a flow rate of about 300 sccm.

14. The method according to claim 10, wherein the metal chloride compound gas, which is supplied into the chamber alternately with the hydrogen gas, is supplied at a flow rate of about 3 to 5 sccm for about 10 to 20 seconds.

15. The method according to claim 10, wherein the hydrogen gas, which is supplied into the chamber alternately with metal chloride compound gas, is supplied at a flow rate of about 2000 sccm for about 10 to 20 seconds at an initial time.

16. The method according to claim 10, wherein 50 W of plasma reaction energy is applied when the hydrogen gas is supplied into the chamber at an initial time.

17. The method according to claim 16, wherein, when the hydrogen gas is supplied into the chamber, the plasma reaction energy is increased by about 50 to 100 W from the plasma reaction energy applied when the hydrogen gas is supplied at an initial time.

18. The method according to claim 10, wherein the metal layer is formed by applying 200 W of plasma reaction energy when the metal chloride compound gas or the purge gas only is supplied into the chamber.

* * * * *